(12) United States Patent
Chen et al.

(10) Patent No.: US 11,809,245 B2
(45) Date of Patent: Nov. 7, 2023

(54) PORTABLE ELECTRONIC DEVICE WITH MOVABLE DOOR COVER

(71) Applicant: Acer Incorporated, New Taipei (TW)

(72) Inventors: Hung-Chi Chen, New Taipei (TW);
Shun-Bin Chen, New Taipei (TW);
Huei-Ting Chuang, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 17/666,555

(22) Filed: Feb. 8, 2022

(65) Prior Publication Data

US 2022/0382345 A1 Dec. 1, 2022

(30) Foreign Application Priority Data

May 28, 2021 (TW) .................................. 110119438

(51) Int. Cl.
*G06F 1/20* (2006.01)
*H05K 7/20* (2006.01)
*G06F 1/16* (2006.01)

(52) U.S. Cl.
CPC ............ *G06F 1/203* (2013.01); *G06F 1/1624* (2013.01); *G06F 1/206* (2013.01); *H05K 7/2039* (2013.01); *H05K 7/20136* (2013.01)

(58) Field of Classification Search
CPC ........ G06F 1/203; G06F 1/1624; G06F 1/206; H05K 7/20136; H05K 7/2039
See application file for complete search history.

(56) References Cited

U.S. PATENT DOCUMENTS

| | | | | |
|---|---|---|---|---|
| 6,008,986 A | * | 12/1999 | Mok | G06F 1/1667 361/679.54 |
| 7,889,500 B2 | * | 2/2011 | Yang | G06F 1/203 361/695 |
| 8,464,961 B2 | * | 6/2013 | Wu | H05K 7/20209 236/49.5 |
| 8,953,327 B1 | | 2/2015 | Salmon | |
| 9,710,026 B2 | * | 7/2017 | Delano | G06F 1/1666 |
| 10,520,995 B2 | * | 12/2019 | Chu | G06F 1/203 |
| 11,036,264 B2 | * | 6/2021 | Zhang | G06F 1/1616 |
| 11,054,872 B2 | * | 7/2021 | Wu | G06F 1/1681 |
| 11,144,103 B2 | * | 10/2021 | Yoo | H05K 7/20136 |
| 2002/0018337 A1 | * | 2/2002 | Nakamura | G06F 1/1616 361/697 |
| 2006/0094347 A1 | * | 5/2006 | Tracy | G06F 1/203 454/184 |
| 2007/0041157 A1 | * | 2/2007 | Wang | G06F 1/203 361/679.48 |

(Continued)

FOREIGN PATENT DOCUMENTS

CN 101130398 2/2008

*Primary Examiner* — Michael A Matey
(74) *Attorney, Agent, or Firm* — JCIPRNET

(57) ABSTRACT

A portable electronic device with a movable door cover including a host, at least one door cover pivoted to the host to be opened or closed relative to the host, at least one linking member connected to the door cover, a shape-memory alloy (SMA) spring connected between the linking member and the host, and a heat source disposed in the host is provided. The SMA spring is affected by heat generated from the heat source to form at least two stretching states, and drives the door cover through the linking member to form at least two states including said being opened or closed.

12 Claims, 7 Drawing Sheets

(56) References Cited

U.S. PATENT DOCUMENTS

| | | | |
|---|---|---|---|
| 2008/0084661 A1* | 4/2008 | Lee | G06F 1/203 |
| | | | 361/679.48 |
| 2010/0112924 A1* | 5/2010 | Alexander | F16K 17/042 |
| | | | 454/70 |
| 2011/0245976 A1* | 10/2011 | Thompson | H05K 7/20209 |
| | | | 700/275 |
| 2014/0160668 A1* | 6/2014 | Heymann | G06F 1/203 |
| | | | 165/96 |
| 2015/0016057 A1* | 1/2015 | Fu | G06F 1/203 |
| | | | 60/527 |
| 2016/0187943 A1* | 6/2016 | Sun | G06F 1/1656 |
| | | | 361/679.09 |
| 2020/0095806 A1* | 3/2020 | Diaz | E05B 51/023 |
| 2020/0337179 A1* | 10/2020 | Ku | H05K 7/2039 |
| 2022/0171439 A1* | 6/2022 | Lin | G06F 1/1681 |

* cited by examiner

PORTABLE ELECTRONIC DEVICE WITH MOVABLE DOOR COVER

CROSS-REFERENCE TO RELATED APPLICATION

This application claims the priority benefit of Taiwan application serial no. 110119438, filed on May 28, 2021. The entirety of the above-mentioned patent application is hereby incorporated by reference herein and made a part of this specification.

BACKGROUND

Technical Field

The disclosure relates to a portable electronic device, and in particular, to a portable electronic device with a movable door cover.

Description of Related Art

Heat dissipation has long been an issue in the mechanical design of portable electronic devices such as laptops and tablet computers. The design of a fan combined with heat dissipation holes is usually adopted for common electronic devices for heat dissipation. However, since the body designs of current electronic devices have gradually become light and thin, relatively less space in a device is available for heat dissipation, which undermines the overall heat dissipation efficiency and fails to meet the heat dissipation demand of the current electronic devices with high-performance computing.

Accordingly, how to overcome conventional limitations of device heat dissipation to increase the heat dissipation efficiency has emerged as a key issue that persons of skill in the art are working on.

SUMMARY

The disclosure is directed to a portable electronic device with a movable door cover facilitating heat dissipation of the portable electronic device by heating or not heating a shape-memory alloy spring to drive the door cover to be opened or closed.

The portable electronic device with the movable door cover provided by the disclosure includes a host, at least one door cover, at least one linking member, a shape-memory alloy spring, and a heat source. The door cover is pivoted to the host to be opened or closed relative to the host. The linking member is connected to the door cover. The shape-memory alloy spring is connected between the linking member and the host. The heat source is disposed in the host. The shape-memory alloy spring is affected by the heat generated by the heat source to form at least two stretching states and drives the door cover through the linking member to form at least two opened and closed states including being opened or closed.

In light of the above, in the portable electronic device, the shape-memory alloy spring and the at least one linking member serve as a drive mechanism of the movable door cover, and at least two stretching states may be formed before and after heating the shape-memory alloy spring by providing heat to the shape-memory alloy spring by the heat source in the host. Accordingly, the door cover may be driven to form at least two opened and closed states including being opened or closed. Based on the above, a user may actively drive the door cover through the heat from the heat source, or the door cover is indirectly driven through the heat from the heat source gradually accumulating in the host. In either way, when the door cover is activated, heat dissipation of the host is performed based on the demand.

DESCRIPTION OF THE EMBODIMENTS

Figure 1:
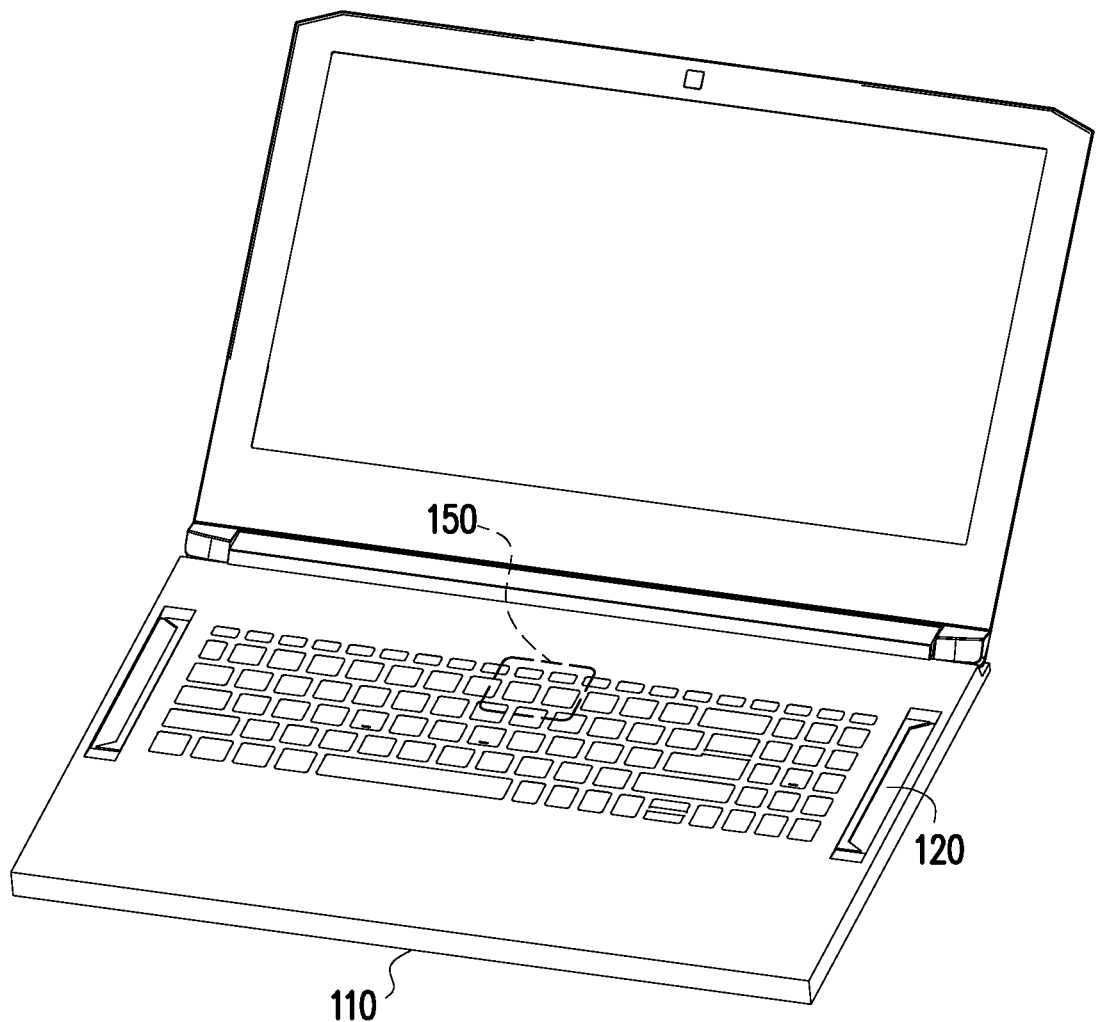
FIG. 1 is a schematic diagram of a portable electronic device according to an embodiment of the disclosure.
Figure 1:
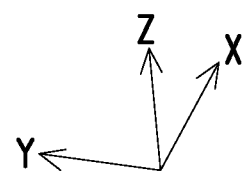
Figure 2:
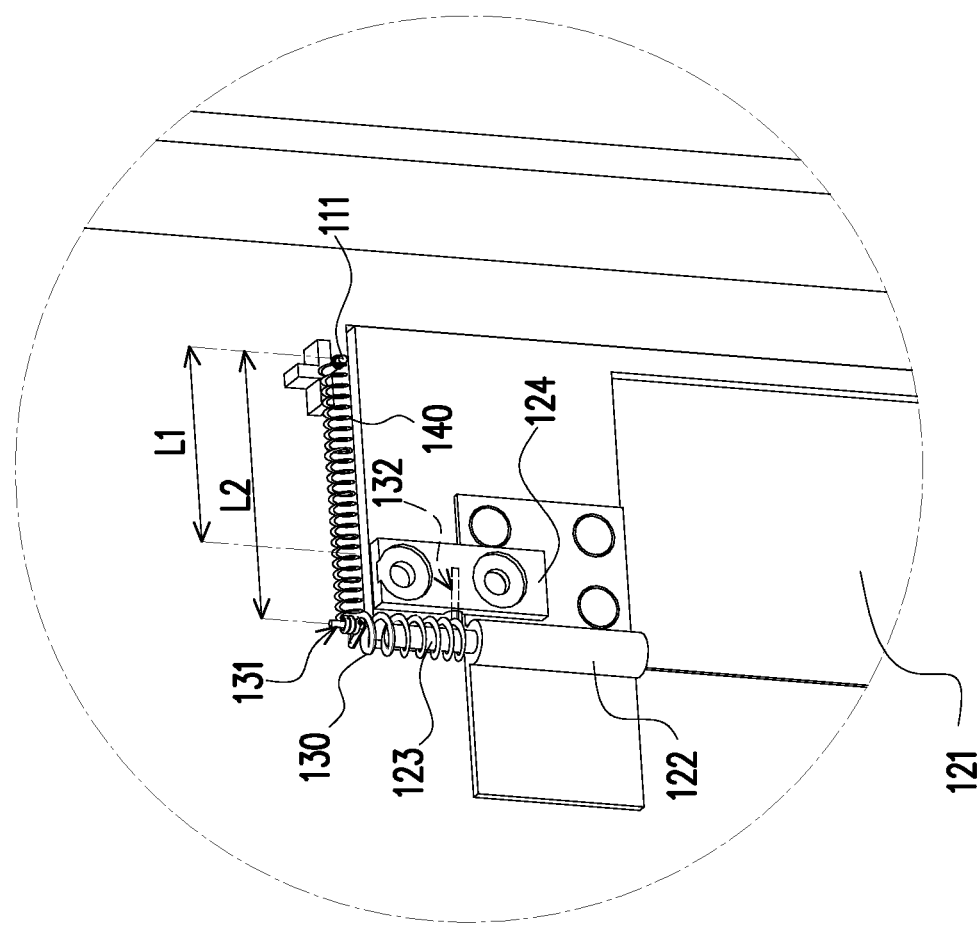
FIG. 2 is a schematic perspective diagram of a partial door cover area of the portable electronic device in FIG. 1.
Figure 2:
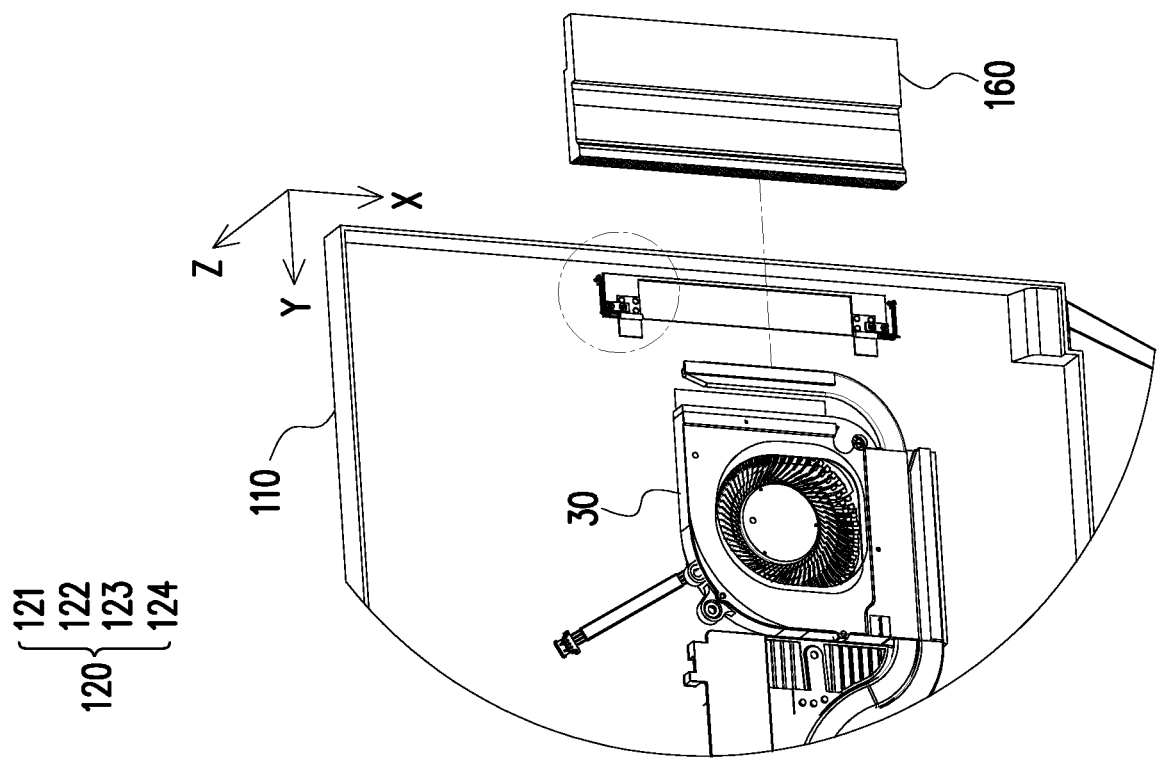
Figure 3:
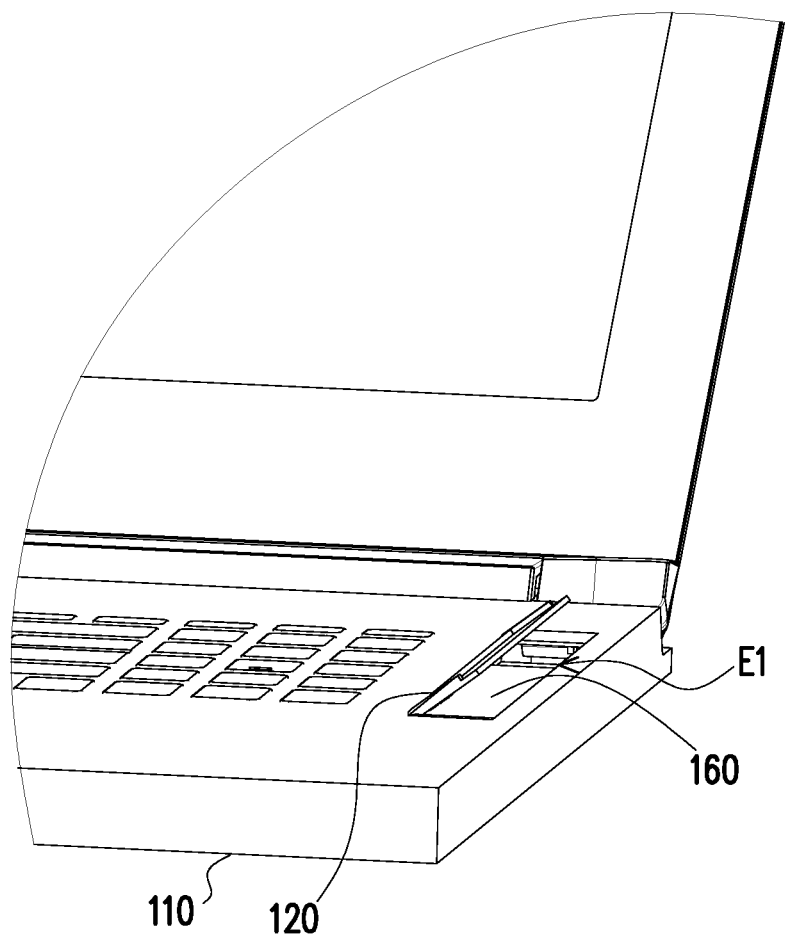
FIG. 3 is a schematic perspective diagram illustrating the door cover in FIG. 1 being opened.

FIG. 1 is a schematic diagram of a portable electronic device according to an embodiment of the disclosure. FIG. 2 is a schematic perspective diagram of a partial door cover area of the portable electronic device in FIG. 1. In the right circle in FIG. 2, the structure features in the left circle are illustrated in a magnified view, and a heat dissipating fin 160 is moved away to the right to ensure that the related structure features are clearly shown. FIG. 3 is a schematic diagram illustrating the door cover in FIG. 1 being opened. The rectangular coordinates X-Y-Z are provided to describe the elements. Referring to FIG. 1 to FIG. 3 together, in the embodiment, a portable electronic device 100, which is, for example, a laptop, includes a host 110, a door cover assembly 120, a linking member 130, a shape memory alloy (SMA) spring 140, a fan 30, and a heat source 150. Here, main electronic elements are disposed in the structure of the host 110, such as a motherboard, a central processing unit, and a display chip. The heat source 150 is disposed in the host 110, and it may be the central processing unit or the display chip. The door cover assembly 120 is disposed on the host 110 to be opened or closed relative to the host 110. The linking member 130 is connected to the door cover assembly 120. The SMA spring 140 is connected between the linking member 130 and an inner protruding portion 111 of the host 110. Accordingly, with the operation of the portable electronic device 100, the heat generated by the heat source 150 gradually accumulates in the host 110 so that the SMA spring 140 is affected by the heat generated by the heat source 150 (including a temperature change before and after being heated) to form at least two stretching states along the Y axis, and the door cover assembly 120 may be driven to pivot through the linking member 130 based on the stretching states. As a result, the door cover assembly 120 forms at least two opened and closed states including being completely opened or completely closed.

Furthermore, as shown in the right side of the FIG. 2, the door cover assembly 120 includes a door cover 121. The door cover 121 is connected to the host 110 through a hinge 122 and spins to be opened and closed relative to the host 110 along the X axis. The linking member 130 is a torsion spring sleeved on a pivot axis 123 beside the hinge 122. An end 131 of the torsion spring is connected to the SMA spring 140, and the other end 132 is fixed to the door cover 121. Here, the door cover assembly 120 of the portable electronic device 100 further includes a fixing member 124 disposed on the door cover 121 to fix the other end 132 of the torsion spring and limit the other end 132 between the fixing member 124 and the door cover 121.

Figure 4:
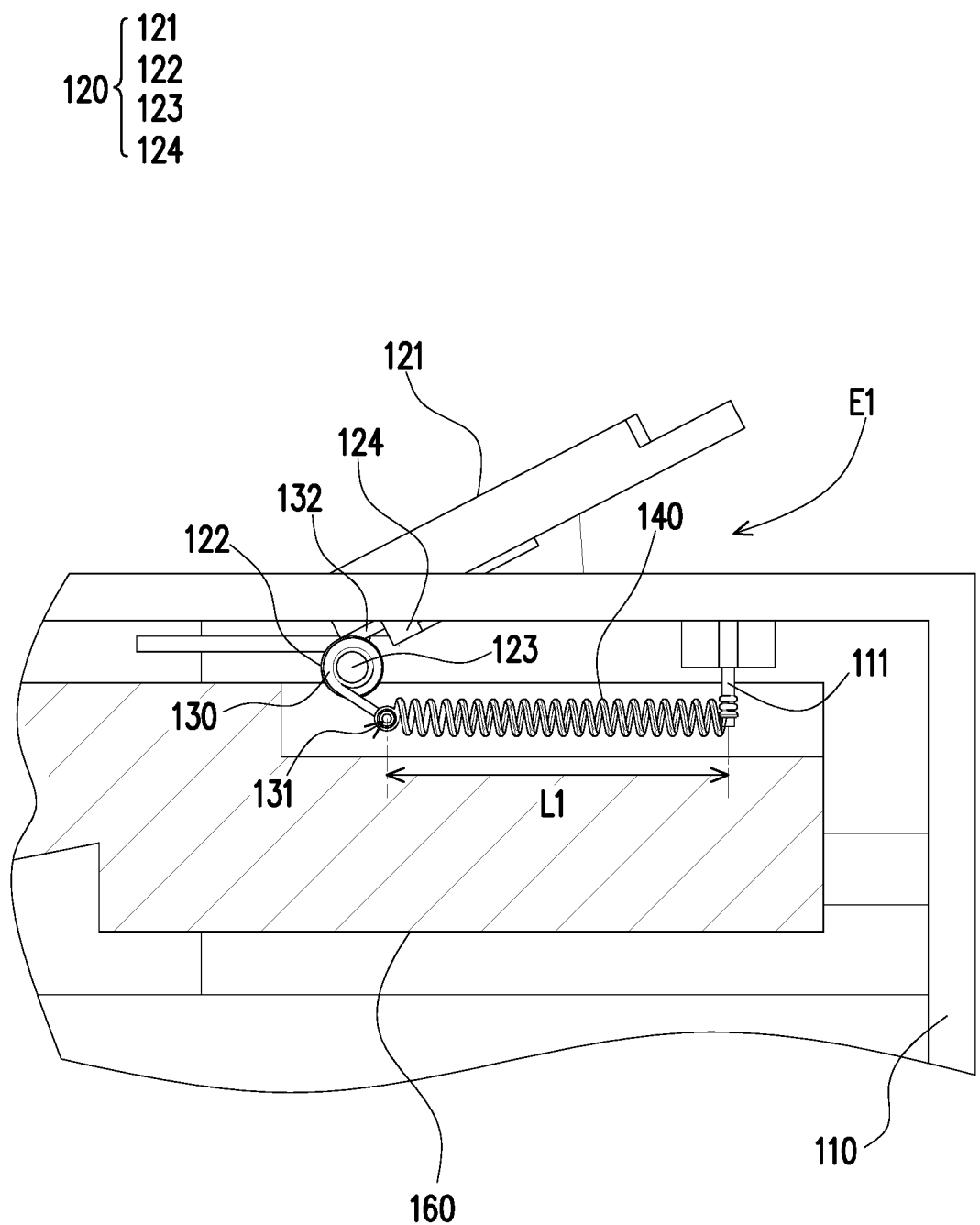
FIG. 4 is a sectional diagram of the partial door cover area of the portable electronic device in FIG. 1.

FIG. 4 is a sectional diagram of the partial door cover area of the portable electronic device in FIG. 1. Referring to FIG. 2 and FIG. 4 together, since a specific distance is formed from a connection area (i.e. the end 131) of the SMA spring 140 and the linking member 130 relative to a central axis (parallel to the X axis) of the pivot axis 123, it means that an arm of force is present from the connection area relative to the central axis. As a result, when the SMA spring 140 stretches and a force is applied to the connection area, torque is formed on the central axis. Then, the torque may cause a displacement (rotation) of an end (i.e. the other end 132) of the torsion spring fixed to the door cover 121 so as to drive the door cover 121 to pivot. The SMA spring 140 of the embodiment has two stretching states which respectively correspond to a memory length L1 and a memory length L2 illustrated. That is, when the SMA spring 140 has the stretching state of the memory length L2, the door cover 121 is closed on the host 110, as shown is FIG. 1. When the SMA spring 140 has the stretching state of the memory length L1, it may drive the door cover 121 to be opened relative to the host 110 through the torsion spring so as to form (open) an opening E1, as shown in FIG. 3 or FIG. 4. In addition, it is further obtained from the above that when the SMA spring 140 has two stretching states or more, the user may further control a pivot angle of the door cover 121 relative to the host 110 based on the stretching types so as to obtain the opening E1 with different states.

Referring to FIG. 1 and FIG. 4 again, the portable electronic device 100 of the embodiment further includes the heat dissipating fin 160 disposed in the host 110 and facing the door cover 121. The heat source 150, for example, transmits heat to the heat dissipating fin 160 through a heat pipe (not shown). As a result, when the door cover 121 is opened relative to the host 110 to form (open) the opening E1, the heat dissipating fin 160 will face the opening E1. Accordingly, the opening E1 may serve as an interface for the heat dissipating fin 160 to access the external environment. Being affected by the fan 30 in the host 110, the heat of the heat dissipating fin 160 may be dissipated by absorbing air into the host 110 from the external environment through the opening E1, or being affected by the fan 30, airflow is generated to transfer the heat of the heat dissipating fin 160 out of the host 110 through the opening E1 so as to dissipate heat. Even in another embodiment which is not illustrated, the host 110 is a structure system without a fan, and the heat dissipating fin 160 may still perform heat exchange with the external environment through the opening E1 which is opened so as to dissipate heat.

In addition, the heat dissipating fin 160 of the embodiment is adjacent to the SMA spring 140, so it may replace the heat source 150 to provide heat to the SMA spring 140. In brief, as the heat accumulates at the heat dissipating fin 160, the stretching states of the SMA spring 140 may change to drive the door cover 121 to pivot.

In another embodiment which is not illustrated, a heater may be disposed beside the SMA spring 140 in the portable electronic device 100, and the heater is electrically connected to the motherboard in the host 110. Hence, the user may control the heater whether to heat the SMA spring 140 and adjust the heating amount through an operation system of the portable electronic device 100 so as to drive the door cover 121.

Figure 5:
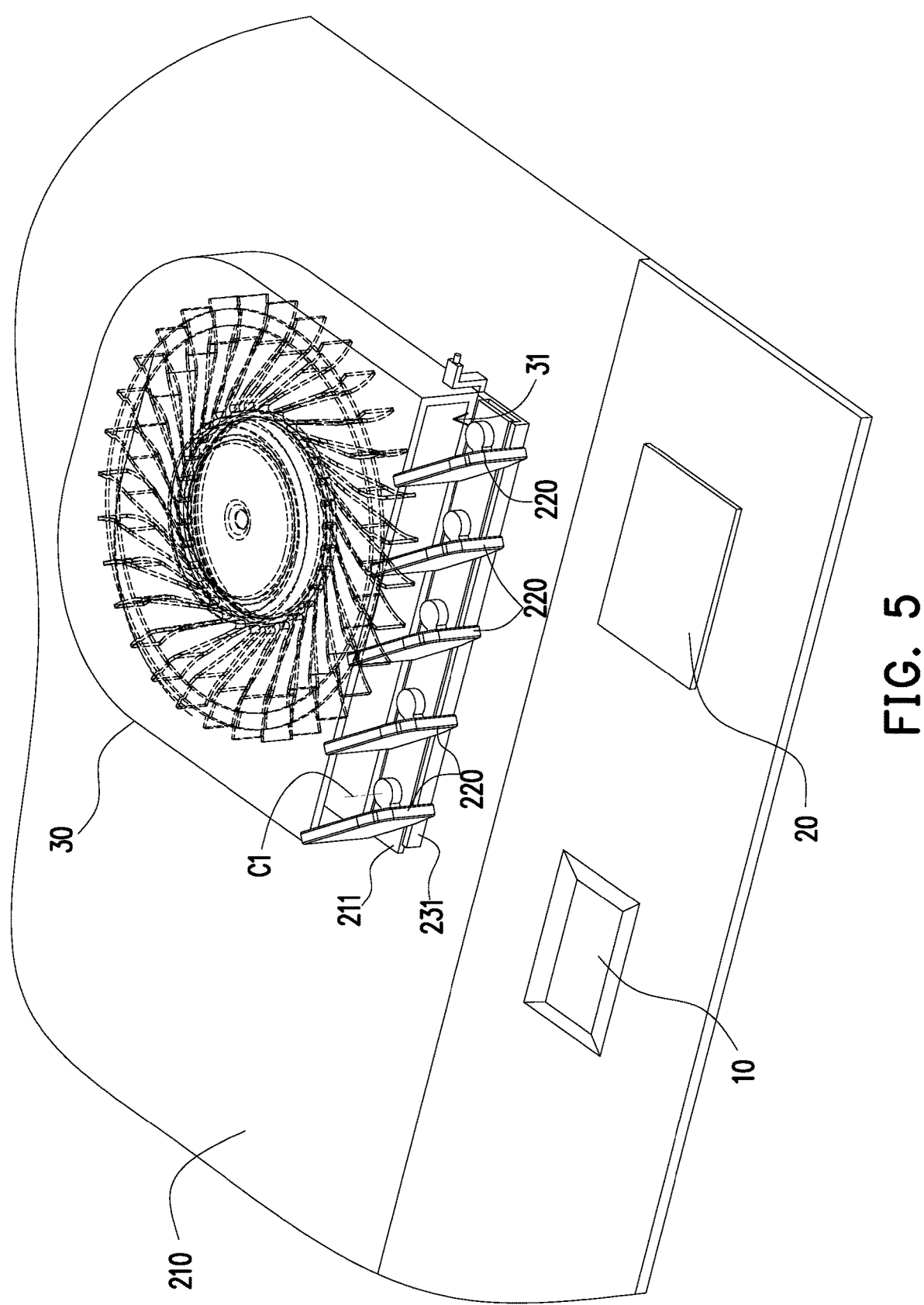
FIG. 5 is a schematic diagram of an internal structure of a portable electronic device according to another embodiment of the disclosure.
Figure 6:
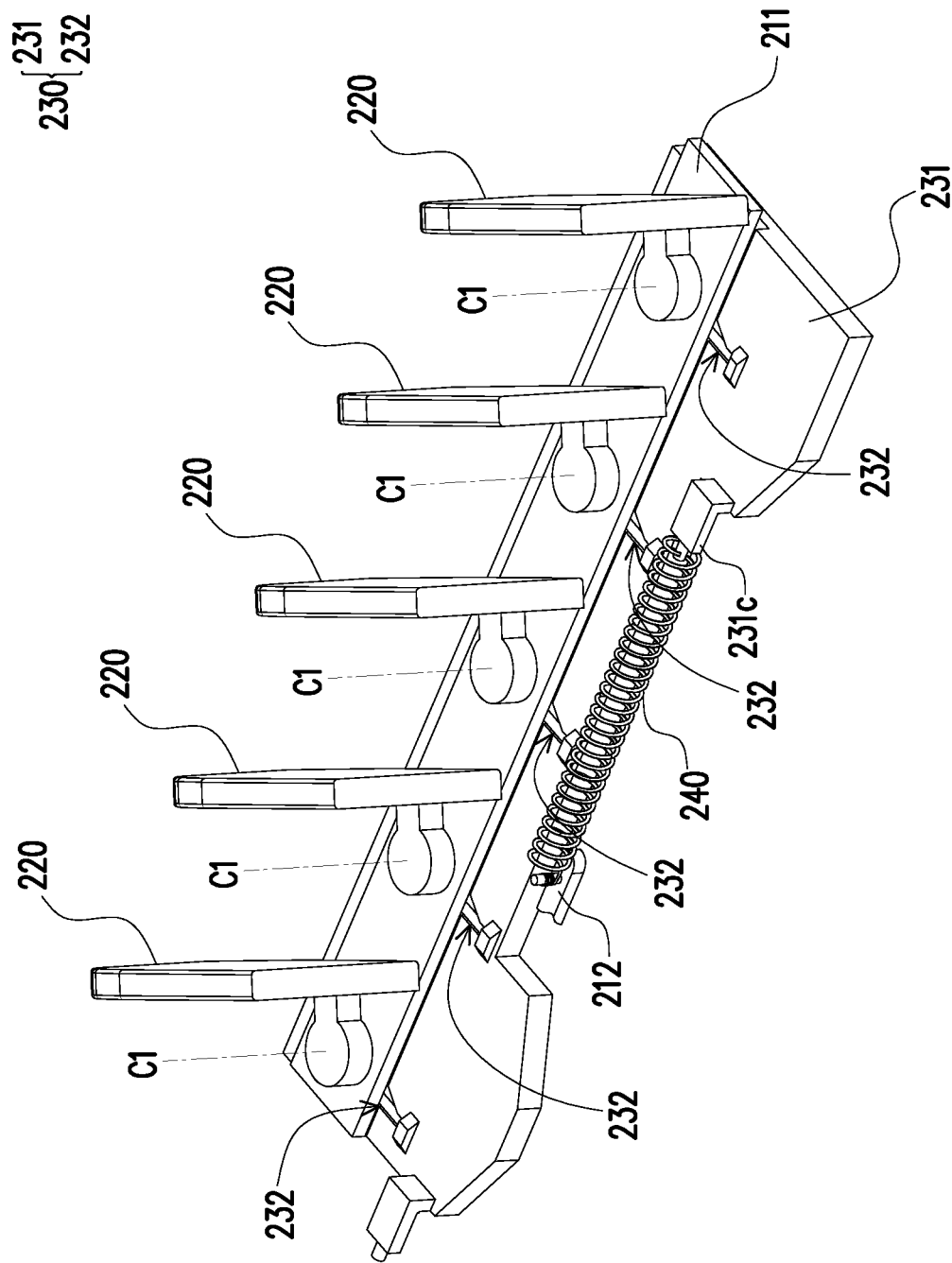
FIG. 6 is a schematic diagram of the door covers in FIG. 5.
Figure 7:
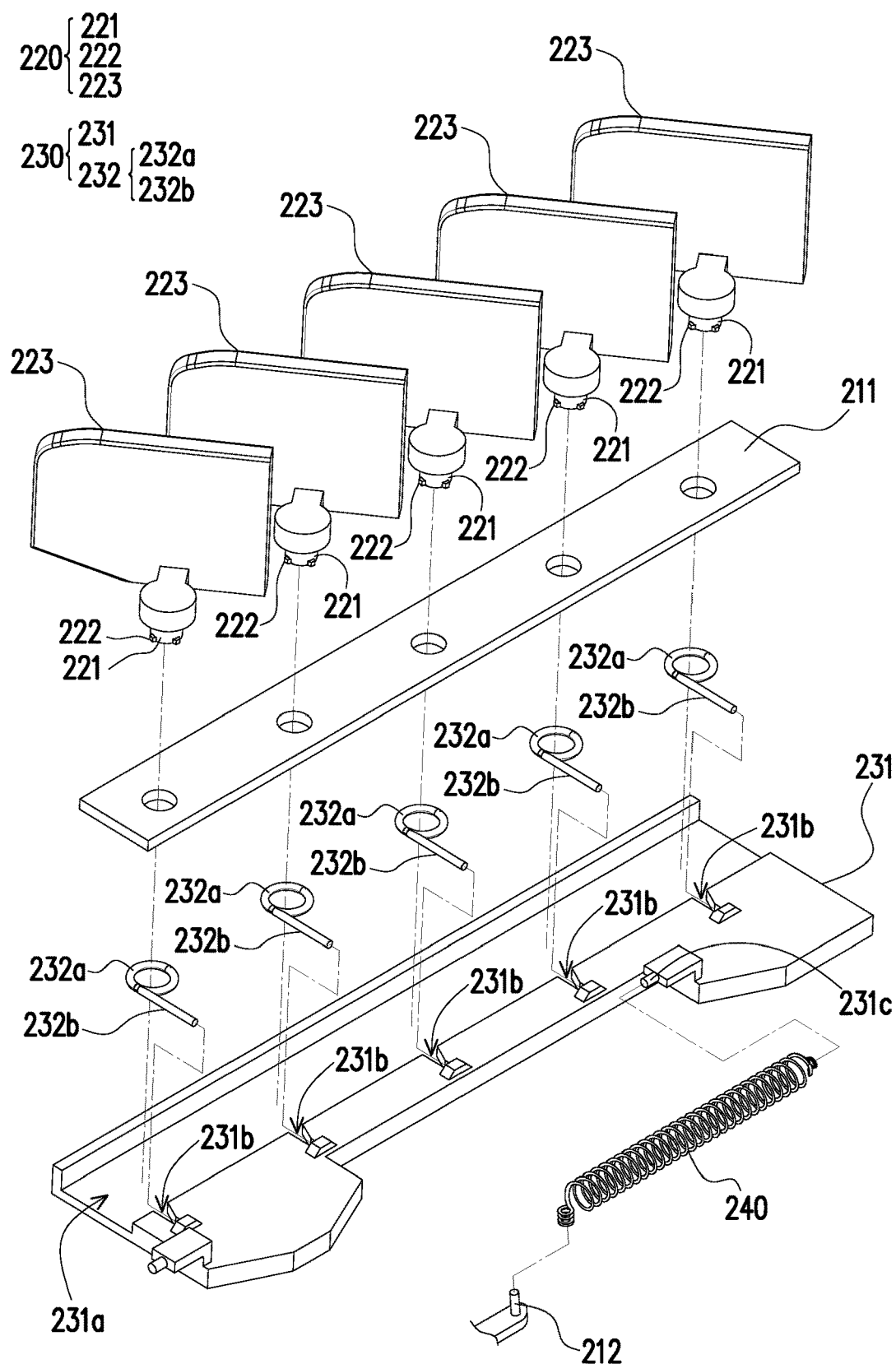
FIG. 7 is an exploded diagram of the door covers in FIG. 6.

FIG. 5 is a schematic diagram of an internal structure of a portable electronic device according to another embodiment of the disclosure. Here, only the partial structure related to the door cover assembly inside the host is illustrated. FIG. 6 is a schematic diagram of the door cover assembly in FIG. 5. FIG. 7 is an exploded diagram of the door cover assembly in FIG. 6. Referring to FIG. 5 to FIG. 7 together, in the embodiment, the portable electronic device includes the fan 30 disposed in a host 210 and multiple door covers 220 disposed at an air outlet 31 of the fan 30. Each of the door covers 220 is pivotally connected to a structure member 211 of the host 210 along a pivot axis C1, and the pivot axes C1 are parallel to each other. An SMA spring 240 simultaneously drives the door covers 220 to pivot through at least one linking member. Furthermore, the portable electronic device further includes a heat source which is, for example, the electronic elements shown in the embodiment such as a central processing unit 10 and a display chip 20. The heat source is close to the air outlet 31 of the fan 30 so that the door covers 220 are located between the air outlet 31 and the electronic elements. Accordingly, airflow may be guided based on the opened and closed states of the door covers 220 to dissipate heat of at least one of the central processing unit 10 and the display chip 20.

Furthermore, at least one of linking members 230 includes a slide plate 231 and multiple hook springs 232. The slide plate 231 is slidably disposed in the host 210 and move back and forth along the transverse direction in the FIG. 5 or FIG. 6. Each of the door covers 220 is connected to the slide plate 231 through the hook springs 232. The SMA spring 240 is connected between the slide plate 231 and the host 210. As shown in FIG. 7, each of the hook springs 232 has a hook 232a and a pole 232b extending from the hook 232a. The door covers 220 include cover plates 223, pivotal connection pillars 221 extending from the cover plates 223, and multiple fastening protruding portions 222 located on the pivotal connection pillars 221. When the pivotal connection pillars 221 are inserted though the openings of the structure member 211, the hooks 232a are sleeved on to the pivotal connection pillars 221 of the door covers 220 and are fastened to the fastening protruding portions 222, so as to move on the poles 232b and to drive the pivotal connection pillars 221 to rotate through the hooks 232a, thus rotating the door covers 220. The poles 232b are fixed to the slide plate 231. The slide plate 231 is coupled to the structure member 211 through a slot 231a so that the slides plate 231 is able to slide relative to the host 210.

In addition, the slide plate 231 has multiple fixing portions 231b, which are, for example, multiple grooves. The poles 232b of the hook springs 232 extend in the direction facing away from the hooks 232a and are accommodated and fixed by the fixing portions 231b. One end of the SMA spring 240 is connected to an end portion 231c of the slide plate 231, and the other end of the SMA spring 240 is connected to a structure member 212 of the host 210. Accordingly, when the stretching states of the SMA spring 240 correspondingly change due to heat accumulation in the host 210, the slide member 231 may be driven to slide relative to the host 210. Hence, the pivotal connection pillars 221 are rotated trough the hook springs 232 so as to rotate the cover plates 223.

In the embodiment, the rotation of the cover plates 223 is equivalent to a change in the airflow guiding angle of the door covers 220 at the air outlet 31 so as to guide the airflow generated by the fan 30 to at least one of the central processing unit 10 and the display chip 20. In the embodiment, the door covers 220 are parallel to each other and form grating openings with a same width therebetween relative to the air outlet 31, so as to guide the airflow generated by the fan 30. Certainly, if the central processing unit 10 and the display chip 20 are at different temperatures due to different operation environment and conditions, the pivot angles of the door covers 220 may change accordingly. Heat dissipating airflow is guided to the one of which heat has to be dissipated first, or each of the door covers 220 pivots by different pivot angles to form the grating openings with different widths therebetween, so as to respectively guide the airflow to the central processing unit 10 or the display chip 20 and adjust the air volume guided to the central processing unit 10 and the display chip 20. In another embodiment, the adjustment of the door covers 220 above may also be performed by disposing a temperature sensor near the heat source to transmit the current temperature to the operation system of the portable electronic device. In this way, the operation system may drive the door covers to adjust the rotation to dissipate heat based on the demand.

In light of the above, in the embodiments of the disclosure, in the portable electronic device, the SMA spring and the at least one linking member serve as a drive mechanism of the movable door cover, and at least two stretching states may be formed before and after heating the SMA spring by providing heat to the SMA spring by the heat source in the host. Accordingly, the door cover may be driven to form at least two opened and closed states including being opened or closed. Based on the above, the user may actively drive the door cover through the heat from the heat source, or the door cover is indirectly driven through the heat from the heat source gradually accumulated in the host. In either way, when the door cover is activated, heat dissipation of the host is performed based on the demand.

In one of the embodiments, the movable door cover serves as an interface to access the environment outside the host, which means the opened door cover forms an opening on the host so that the cold air in the environment outside may flow into the host, or the heat in the host may be dissipated to the environment outside through the opening. Hence, heat exchange between the environments inside and outside the host is performed so that heat dissipation efficiency of the portable electronic device may be increased.

In one of the embodiments, the movable door covers are configured to guide the heat dissipating airflow generated by the fan to at least one of multiple objects demanding heat dissipation due to different pivot angles of the door covers. The user or the operation system of the portable electronic device may adjust the pivot angles of the door covers based on different objects of heat dissipation or current heat generation states so as to increase the heat dissipation efficiency of the portable electronic device.

What is claimed is:

1. A portable electronic device with a movable door cover, the portable electronic device comprising:
   a host;
   at least one door cover pivoted to the host to be opened or closed relative to the host;
   at least one linking member connected to the door cover;
   a shape-memory alloy (SMA) spring connected between the linking member and the host;
   a heat source disposed in the host; and
   a hinge, wherein the door cover is pivotally connected to the host with the hinge, the linking member is a torsion spring sleeved on a pivot axis of the hinge, one end of the torsion spring is fixed to the door cover, and the other end of the torsion spring is connected to the SMA spring, wherein the SMA spring is affected by the heat generated by the heat source to form at least two stretching states and drive the door cover through the linking member to form at least two opened and closed states including said being opened or closed.

2. The portable electronic device with the movable door cover according to claim 1, further comprising a fixing member disposed to the door cover, wherein the one end of the torsion spring is fixed and limited between the fixing member and the door cover.

3. The portable electronic device with the movable door cover according to claim 1, further comprising a heat dissipating fin disposed in the host, wherein an opening is formed when the heat dissipating fin is opened relative to the host facing the door cover.

4. The portable electronic device with the movable door cover according to claim 1, comprising a plurality of door covers respectively pivotally connected to the host along a plurality of pivot axes, wherein the pivot axes are parallel to each other, and the SMA spring simultaneously drives the door covers to pivot through the at least one linking member.

5. The portable electronic device with the movable door cover according to claim 4, wherein the at least one linking member comprises a slide plate and a plurality of hook springs, the slide plate is slidably disposed in the host, each of the door covers is connected to the slide plate through the hook springs, and the SMA spring is connected between the slide plate and the host.

6. The portable electronic device with the movable door cover according to claim 5, wherein each of the hook springs has a hook and a pole extending from the hook, the hooks are fixed on to the door cover to rotate the door cover, and the poles are fixed to the slide plate.

7. The portable electronic device with the movable door cover according to claim 6, wherein the slide plate has a plurality of fixing portions to accommodate and fix the poles.

8. The portable electronic device with the movable door cover according to claim 4, wherein the door covers are parallel to each other.

9. The portable electronic device with the movable door cover according to claim 4, wherein the door covers form a plurality of grating openings.

10. The portable electronic device with the movable door cover according to claim 4, wherein the heat source is a central processing unit, a display chip, or a heater disposed in the host.

11. The portable electronic device with the movable door cover according to claim 4, further comprising a fan and a plurality of electronic elements, wherein the door covers are located between an air outlet of the fan and the electronic elements, and the opened and closed states of the door covers affect airflow generated by the fan and guide the airflow to at least one of the electronic elements.

12. The portable electronic device with the movable door cover according to claim 11, wherein at least one of the electronic elements forms the heat source.

* * * * *